US 6,683,373 B1

(12) United States Patent
Vendier et al.

(10) Patent No.: US 6,683,373 B1
(45) Date of Patent: Jan. 27, 2004

(54) METHOD OF MODIFYING CONNECTING LEADS AND THINNING BASES OF ENCAPSULATED MODULAR ELECTRONIC COMPONENTS TO OBTAIN A HIGH-DENSITY MODULE, AND A MODULE OBTAINED THEREBY

(75) Inventors: Olivier Vendier, Lacroix-Falgarde (FR); Norbert Venet, La Salvetat St Gilles (FR); Philippe Calvel, Muret (FR); Stéphane Albinet, Plaisance Du Touch (FR); Jean-Cyril Esther, Vigoulet Auzil (FR); Marc Huan, Cox (FR)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 10/048,582

(22) PCT Filed: Aug. 8, 2000

(86) PCT No.: PCT/FR00/02217

§ 371 (c)(1),
(2), (4) Date: May 10, 2002

(87) PCT Pub. No.: WO01/09941

PCT Pub. Date: Feb. 8, 2001

(30) Foreign Application Priority Data

Aug. 2, 2000 (FR) .............................................. 99 10011

(51) Int. Cl.$^7$ ............................................... H01L 23/02
(52) U.S. Cl. ..................... 257/686; 257/685; 257/787; 257/723; 257/724
(58) Field of Search .................... 257/685, 686, 257/787, 724, 723, 692, 735, 775

(56) References Cited

U.S. PATENT DOCUMENTS 4,017,963 A * 4/1977 Beyerlein .................... 257/686
5,604,377 A * 2/1997 Palagonia .................... 257/685
5,656,856 A * 8/1997 Kweon ........................ 257/686

(List continued on next page.)

FOREIGN PATENT DOCUMENTS

| DE | 3233195 A1 * | 9/1982 | ........... H01L/23/52 |
| EP | 0 858 101 A1 | 8/1998 | |
| GB | 2218847 * | 11/1989 | ........... H01L/23/48 |

(List continued on next page.)

OTHER PUBLICATIONS

S. Larcombe et al, "An Ultra High Density Technology for Microsystems", Microelectronics International, GB, Wela, Port Elin, vol. 41, Sep. 1996, pp. 15–18, XP000890024.
J. Barrett et al, Performance and Reliability of a Three-Dimensional Plastic Moulded Vertical Multichip Module (MCM-V) Proceedings of the Electronic Components and Technology Conference, US, NY, III, vol. Conf. 45, 1995 pp. 656–663, XP000889860.F (List continued on next page.)

Primary Examiner—Jasmine Clark
(74) Attorney, Agent, or Firm—Sughrue Mion, PLLC

(57) ABSTRACT

A method of obtaining a module (4), and the module obtained, from modular electronic components encapsulated in flat monoblock packages (1A) in which elements constituting the components are buried and from which project laterally conductive connecting leads (3A), the packages being stacked and buried in an insulative block corresponding to at least one module and the projecting connecting leads of the stacked packages being flush with a surface of the block, on at least one face of said block on which are formed conductive interconnection tracks and/or contacts for connecting the leads with connecting means external to the module. The method includes, before stacking the packages, an operation of modifying the connecting leads of the packages in order to reduce their overall size and an operation of reducing the height of the packages by thinning their respective bases.

15 Claims, 1 Drawing Sheet

U.S. PATENT DOCUMENTS

| | | | |
|---|---|---|---|
| 5,663,105 A | * 9/1997 | Sua et al. | 438/109 |
| 5,677,569 A | 10/1997 | Choi et al. | |
| 5,744,827 A | 4/1998 | Jeong et al. | |
| 5,754,405 A | * 5/1998 | Derouiche | 361/744 |
| 5,811,877 A | 9/1998 | Miyano et al. | |
| 5,835,988 A | * 11/1998 | Ishii | 257/685 |
| 5,885,850 A | 3/1999 | Val | |
| 5,960,539 A | * 10/1999 | Burns | 29/854 |
| 6,028,352 A | * 2/2000 | Eide | 257/696 |
| 6,091,142 A | * 7/2000 | Lee | 257/713 |
| 6,180,881 B1 | * 1/2001 | Isaak | 174/52.4 |
| 6,262,476 B1 | * 7/2001 | Vidal | 257/686 |
| 6,404,662 B1 | * 6/2002 | Cady et al. | 257/723 |
| 6,475,831 B2 | * 11/2002 | Moden et al. | 438/109 |

FOREIGN PATENT DOCUMENTS

| | | | |
|---|---|---|---|
| JP | 58-219757 | * 12/1983 | 257/686 |
| JP | 59-205747 | * 11/1984 | 257/686 |
| JP | 61-101067 | * 5/1986 | 257/686 |
| JP | 9-239787 | 9/1987 | |
| JP | 62-293749 | * 12/1987 | 438/109 |

OTHER PUBLICATIONS

C. M. Val, "The future of 3D packaging", $2^{ND}$ 1998 IEMT/IMC Symposium (IEEE Cat. No. 98EX225), $2^{nd}$ 1998 IEMT/IMC Symposium, Tokyo, Japan, Apr. 15–17, 1998, pp. 261–271, XP002135917.

* cited by examiner

METHOD OF MODIFYING CONNECTING LEADS AND THINNING BASES OF ENCAPSULATED MODULAR ELECTRONIC COMPONENTS TO OBTAIN A HIGH-DENSITY MODULE, AND A MODULE OBTAINED THEREBY

FIELD OF THE INVENTION

The invention relates to a method of obtaining a high-density module from encapsulated modular electronic components. It also relates to modules made up of electronic components obtained by the method, in particular mass memory modules.

DESCRIPTION OF RELATED ART

Many electronic components are sold in encapsulated modular form and in particular in the form of molded plastics material packages in which the elements constituting the component are buried and provided with connecting leads that project laterally from the package. This is known in the art. In one standard package, the connecting leads are curved so that a flat part is pressed against a printed circuit on which the package rests. This applies in particular to components encapsulated in TSOP (Thin Small Outline Packages), enabling thin assemblies to be produced at reduced cost compared to the corresponding prior art techniques.

In many technical fields, and in the aerospace field in particular, a significant research effort is devoted to miniaturizing equipment to save bulk, weight and cost. This is also well known in the art.

One example of a solution with this aim is disclosed in the document U.S. Pat. No. 5,885,850, which describes the production of modules each made up of a stack of flat encapsulated component packages buried in a block of resin hardened so that the connecting leads of the component are flush with the surface of the block, on at least one face of the block, and can be interconnected and rendered accessible from outside the block by appropriate connecting means known in the art. This MCM-V (Multiple Chips Module-Vertical) technique provides high-density mass memory modules, for example, by vertically stacking TSOP memory chips of the same kind with the ends of their connecting leads interconnected on the faces intended to constitute the flanks of the modules, which are cubic.

However, the packages which can be used to produce modules by stacking them were initially designed to be mounted individually on printed circuits and are relatively thick, for various reasons associated with the conditions of their fabrication, use and their destination. Their thickness is due, among other things, to the need to obtain a stiffness of the packages enabling them to be manipulated without risk of damaging the components that they contain during operations of mounting them on circuit boards. It is also necessary to eliminate the risk of delamination of the molding material at the bottom of the package, under the layer on which the components are formed, which is usually a layer of silicon.

SUMMARY OF THE INVENTION

One object of the invention is therefore to exploit a stacking method like that described in the document U.S. Pat. No. 5,885,850 referred to above to produce modules to enable stacking of a significantly greater number of packages than has been possible until now, with equivalent overall dimensions of the finished module.

The maximum height of a module that can be mounted on a printed circuit forming part of an assembly consisting of printed circuits disposed in parallel, for example in an equipment rack, is limited by the spacing between the parallel printed circuits, which is generally standardized. This is known in the art. An increase in the density of components in the vertical plane, for the same module height, can therefore achieve significant savings in terms of the overall size per card, and even reduce the number of cards needed.

The invention therefore proposes a method of obtaining a high-density module from modular electronic components encapsulated in flat monoblock packages in which the elements constituting the components are buried and from which project laterally conductive connecting leads of said elements, in which method the packages are stacked and buried in an insulative block corresponding to at least one module so that the projecting connecting leads of the stacked packages are flush with a surface of the block, on at least one face of said block on which, as required, are formed conductive tracks interconnecting leads and/or contacts for connecting the leads with connecting means external to the module, said method being characterized in that it includes, before stacking the packages, an operation of modifying the connecting leads of the packages in order to reduce their overall size and an operation of reducing the height of the packages by thinning their respective bases.

One embodiment of the method includes reducing the height of the packages by at least partly eliminating a uniform thickness of the molded material constituting the bottom wall of each package.

One embodiment of the method includes reducing the height of the packages by eliminating from the bottom thereof the material constituting the bottom wall of each package and a limited uniform thickness of the substrate layer for component elements that is parallel to said bottom wall in each package.

In one embodiment of the method the operation of modifying the connecting leads of the packages includes a phase of flattening each lead, preferably in a plane parallel to the planes defined by the bottom and top walls of the package, and a phase of homogeneously shortening the leads.

The invention also provides a module produced in the form of a block in which is buried a stack of flat monoblock modular packages of electronic components in which elements constituting the components are buried and from which project laterally conductive connecting leads of said elements, said leads being flush with the surface of the insulative block constituting the module on at least one face of said block on which, as required, are formed conductive tracks interconnecting leads and/or contacts for connecting the leads with connecting means external to the module, characterized in that it includes a stack formed of packages whose respective heights have been reduced by thinning their respective bases, before stacking, and that have preferably had eliminated from their bottom the material of the bottom wall and a limited thickness of a substrate layer for component elements that is parallel to the bottom and top walls of the package.

BRIEF DESCRIPTION OF THE DRAWINGS

The invention, its features and its advantages are explained in the following description, which is given with reference to the drawings listed below.

DETAILED DESCRIPTION OF THE INVENTION

Figure 1:
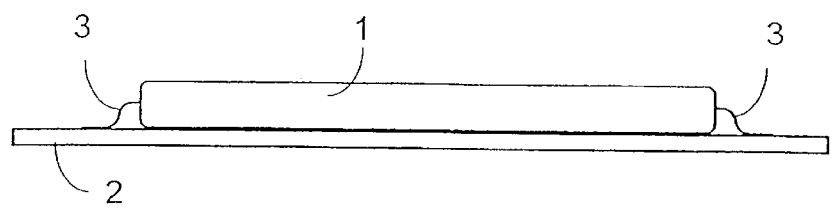
FIG. 1 is a diagrammatic representation of a prior art encapsulated electronic component package.
Figure 3:
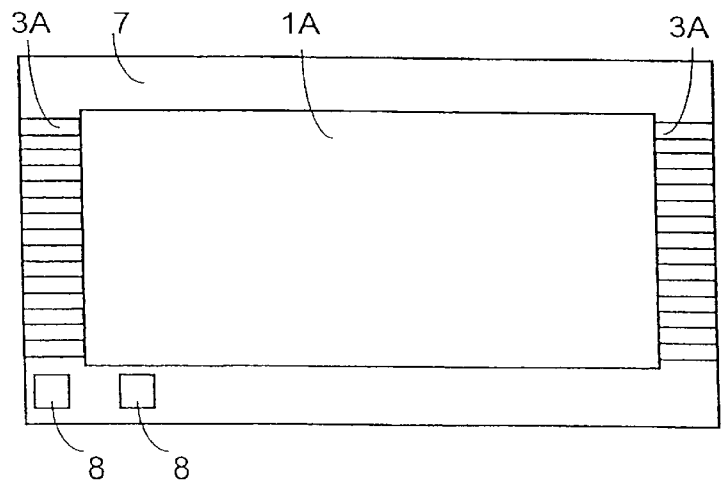
FIG. 3 is a diagrammatic representation of a section of a different embodiment of a module according to the invention.

The package 1 shown diagrammatically in FIG. 1 is a standard flat rectangular package, seen from the side, in which elements constituting one or more electronic components are encapsulated. At least some elements are usually formed on a substrate parallel to the larger faces of the package, FIG. 3 showing the larger face 1A of the package. Here the larger faces constitute the top of the package and its bottom, which is pressed against a support 2 such as a printed circuit.

The elements of the component or components contained in the package are connected to conductive connecting leads 3 which project laterally from the package on at least one lateral face thereof. In a standard embodiment the leads are curved as shown diagrammatically in FIG. 1 so that a flat end of each of them can be pressed onto a complementary connecting land carried by the surface of the printed circuit support 2, against which the package is pressed.

Highly diverse electronic components are encapsulated in this way, for example modular memory components. In one widely used standard package, the elements of the components are buried in a molded insulative material and the molding operations simultaneously produce a series of modular packages of rectangular shape which are separated from each other after the molding operations are completed. It is therefore possible to obtain flat and very thin packages 1, usually called TSOP (see above).

As already mentioned, these rectangular packages are intended to be manipulated separately and must therefore be relatively rigid so that they can be manipulated easily. For this reason, and for other technical reasons, they are still relatively thick, and reducing their thickness can therefore be envisaged, if necessary, and in particular if it is intended that they be embedded in a block after stacking them.

As already mentioned, the document U.S. Pat. No. 5,885, 850 discloses a method of obtaining modules each consisting of a stack of flat encapsulated component packages buried in a block of hardened resin. In the above method the connecting leads of the components are flush with the surface of the block on at least one face of the block and can be interconnected and rendered accessible from outside the block by appropriate connecting means known in the art. This MCM-V technique can of course be applied to packages, especially TSOP, as referred to above. The use of such packages to form a stack, after they have been individually made thinner, greatly increases the density of components achieved by stacking, at a moderate cost if it is possible to use off the shelf components after they undergo operations to reduce their overall size and especially their overall thickness before stacking them.

In accordance with the invention, these preparatory operations are of two types, one of which modifies the connecting leads to reduce their overall size outside the package from which they project, and the other of which makes the packages thinner.

The packages are made thinner, to reduce their height, by eliminating a uniform thickness of at least part of the base of each package.

For example, this is effected by abrasion of the molded material bottom wall which is on the underside of each package, i.e. underneath it. This can extend to total elimination of the bottom wall, in which case the base of the package essentially consists of whatever was previously juxtaposed to the bottom wall, for example the substrate layer on which at least some of the elements of the component or components of the package are produced.

Figure 2:
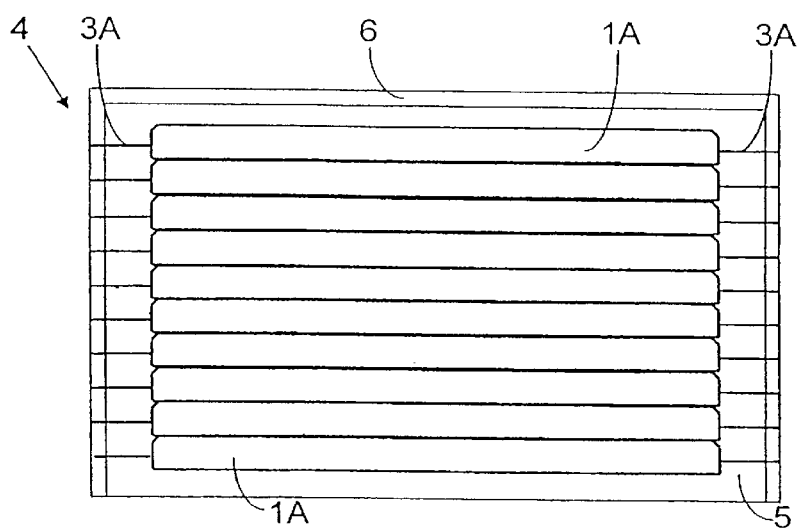
FIG. 2 is a diagrammatic representation of a module in accordance with the invention made up of thinned packages.

In one embodiment there is further provision for eliminating a limited uniform thickness of the substrate layer that was Juxtaposed to the bottom wall before the latter was eliminated. This further reduces the thickness of each package so that an increased number of packages can be stacked in each module, for the same module height relative to the previous situation. FIG. 2 is a diagrammatic representation of a module 4 obtained using the MCM-V technique with packages 1A obtained by the method according to the invention. The stack of thinned packages 1A is buried in a molded resin body 5 of rectangular parallelepiped shape with metallization 6 on at least one of its faces. The metallization is partly eliminated in a particular manner so that it remains practically only in the form of electrical and/or thermally conductive elements, such as conductive tracks, conductive lands, heat sinks and/or shielding. Contacts are also provided for connecting at least some of the connecting leads of the packages, which are flush with the surface of the block that the module forms, with external connection means, not shown, for example of the conductive ball type.

In accordance with the invention, and as stated above, there is also provision for modifying the connecting leads projecting from each package 1A, with a view to limiting their overall size and facilitating the operations of thinning and stacking the packages 1A that include them.

In a preferred embodiment, the connecting leads projecting laterally from each package intended to be thinned are subjected to a mechanical flattening phase so that they lie in a plane parallel to the planes defined by the base and top walls of the package. There is also provision for homogeneously shortening the flattened connecting leads of the packages when the packages can be made thinner to form part of the same stack of packages 1A. For example, all the connecting leads intended to project from the same face of a module 4 are shortened identically. Shortening the connecting leads of the packages before stacking so that the connecting leads 3A obtained after flattening and shortening them are flush at a common level relative to the face of the block on which they are apparent can be envisaged, in particular if the stacked packages are not all strictly identical and some of them have larger faces of slightly different sizes. It is of course possible to check that each thinned package is operating correctly before stacking them to avoid installing a defective package and before checking that the module obtained operates correctly.

There can possibly also be provision for inserting a printed circuit 7 or an edge of a lead frame between two successive packages 1A of a stack intended to be buried in the molded block of a module 4, to meet different requirements. In particular, this can be for a connection between packages inside the block itself, and/or for mounting discrete components 8, for example SMC, on a lead frame edge or around at least one of the two packages juxtaposed to the printed circuit, before the combination is buried in a module block.

What is claimed is:

1. A method of obtaining a high-density module (4) from modular electronic components encapsulated in flat monoblock packages (1) in which the elements constituting the components are buried and from which project laterally conductive connecting leads (3) of said elements, in which method the packages are stacked and buried in an insulative block corresponding to at least one module so that the projecting connecting leads of the stacked packages are flush with a surface of the block, on at least one face of said block on which, as required, are formed conductive tracks interconnecting leads and/or contacts for connecting the leads with connecting means external to the module, said method being characterized in that it includes, before stacking the packages (1A), an operation of modifying the connecting leads of the packages in order to reduce their overall size and an operation of reducing the height of the packages by thinning their respective bases.

2. A method according to claim 1 including reducing the height of the packages by at least partly eliminating a uniform thickness of the molded material constituting the bottom wall of each package.

3. A method according to claim 1 including reducing the height of the packages by eliminating from the bottom thereof the material constituting the bottom wall of each package and a limited uniform thickness of the substrate layer for component elements that is parallel to said bottom wall in each package.

4. A method according to claim 1, wherein the operation of modifying the connecting leads of the packages includes a phase of flattening each lead, preferably in a plane parallel to the planes defined by the bottom and top walls of the package, and a phase of homogeneously shortening the leads.

5. A module produced in the form of a block in which is buried a stack of flat monoblock modular packages (1A) of electronic components in which elements constituting the components are buried and from which project laterally conductive connecting leads (3A) of said elements, said leads being flush with the surface of the insulative block constituting the module on at least one face of said block on which, as required, are formed conductive tracks interconnecting leads and/or contacts for connecting the leads with connecting means external to the module, characterized in that the module includes a stack formed of packages whose respective heights have been reduced by thinning their respective bases, before stacking.

6. A module according to claim 5 including at least one printed circuit (7) or a lead frame edge interleaved between two stacked packages (1A).

7. A module according to claim 5 in the form of a block containing a stack of thinned packages (1A) with at least approximately the same dimensions whose projecting lateral connecting leads (3A) are flush with the surface of the block, on at least one face of said block, and are disposed flat in parallel planes whose orientation is at least approximately parallel to the planes that the bottom and top of each stacked package define.

8. A method of obtaining a high-density module, comprising the steps of:
    providing a plurality of flat monoblock packages in which modular electronic components are encapsulated from which project laterally conductive connecting leads of the components;
    reducing the height of each of the packages by thinning their respective bases;
    stacking the packages after the step of reducing the height of the packages; and
    burying the stacked packages in an insulative block to form a high-density module;
    wherein the projecting connecting leads of the stacked packages are flush with a surface of the block, on at least one face of the block on which are formed conductive tracks interconnecting leads and/or contacts for connecting the leads with connections external to the module.

9. The method of claim 8, wherein said step of reducing the height each of the packages includes partly eliminating a uniform thickness of the molded material constituting the bottom wall of each package.

10. The method of claim 8, wherein said step of reducing the height each of the packages includes eliminating from the bottom thereof material constituting a bottom wall of each package and a limited uniform thickness of a substrate layer for component elements that is parallel to the bottom wall in each package.

11. The method of claim 8, further comprising the step of shortening the connecting leads prior to said step of burying the stacked packages, so that ends of the leads projecting from a same side are substantially flush with the face of the insulative block.

12. The module according to claim 5, wherein the stack formed of packages whose respective heights have been reduced by thinning their respective bases, before stacking, have had eliminated from their bottom the material of the bottom wall and a limited thickness of a substrate layer for component elements that is parallel to the bottom and top walls of the package.

13. The module according to claim 6, wherein the at least one printed circuit or a lead frame edge interleaved between two stacked packages interconnects packages.

14. The module according to claim 6, wherein the at least one printed circuit or a lead frame edge interleaved between two stacked packages mounts discrete components on an edge or around at least one of the packages between which the circuit is inserted in the block that the module constitutes.

15. The module according to claim 6, wherein the at least one printed circuit or a lead frame edge interleaved between two stacked packages interconnects packages and mounts discrete components on an edge or around at least one of the packages between which the circuit is inserted in the block that the module constitutes.

* * * * *